(12) United States Patent
Sato (10) Patent No.: US 9,322,878 B2
(45) Date of Patent: Apr. 26, 2016

(54) SEMICONDUCTOR DEVICE, PHYSICAL QUANTITY SENSOR, ELECTRONIC APPARATUS, AND MOVING OBJECT

(71) Applicant: Seiko Epson Corporation, Tokyo (JP)

(72) Inventor: Hideki Sato, Suwa (JP)

(73) Assignee: Seiko Epson Corporation (JP)

( * ) Notice: Subject to any disclaimer, the term of this patent is extended or adjusted under 35 U.S.C. 154(b) by 96 days.

(21) Appl. No.: 14/227,253

(22) Filed: Mar. 27, 2014

(65) Prior Publication Data

US 2014/0298127 A1    Oct. 2, 2014

(30) Foreign Application Priority Data

Mar. 28, 2013  (JP) ................................. 2013-069497

(51) Int. Cl.
  *G01R 31/3185*   (2006.01)
  *G01R 31/3167*   (2006.01)

(52) U.S. Cl.
  CPC  *G01R 31/318536* (2013.01); *G01R 31/318558* (2013.01); *G01R 31/3167* (2013.01); *G01R 31/318541* (2013.01)

(58) Field of Classification Search
  CPC ............... G01R 31/318536; G01R 31/318541; G01R 31/3167; G01R 31/318558
  USPC ........................................................ 714/726
  See application file for complete search history.

(56) References Cited

U.S. PATENT DOCUMENTS

| | | | | |
|---|---|---|---|---|
| 5,793,778 A * | 8/1998 | Qureshi | ......... | G01R 31/318536 714/727 |
| 6,717,415 B2 * | 4/2004 | Sunter | .............. | G01R 31/31855 324/519 |
| 6,988,228 B2 * | 1/2006 | Paglieri | .......... | G01R 31/318558 714/726 |
| 6,990,618 B1 * | 1/2006 | Lulla | .............. | G01R 31/318541 714/727 |
| 7,246,287 B1 * | 7/2007 | Chua-Eoan | .... | G01R 31/318536 714/724 |
| 7,274,203 B2 * | 9/2007 | Tumin | ................ | G01R 31/3172 324/762.02 |
| 7,421,634 B2 * | 9/2008 | Puvvada | ........ | G01R 31/318594 714/726 |
| 7,788,558 B2 * | 8/2010 | Shimooka | ...... | G01R 31/318536 714/726 |
| 7,861,128 B1 * | 12/2010 | Moore | ........... | G01R 31/318541 714/30 |
| 7,996,738 B2 * | 8/2011 | Gemmeke | ...... | G01R 31/318575 714/726 |
| 8,612,810 B2 * | 12/2013 | Roselli | .................. | G06F 1/1613 702/141 |
| 2004/0064770 A1 * | 4/2004 | Xin | ................ | G01R 31/318555 714/726 |
| 2007/0158531 A1 * | 7/2007 | Knee | ...................... | H04N 3/155 250/208.1 |
| 2009/0300448 A1 * | 12/2009 | Tomita | ........... | G01R 31/318541 714/731 |
| 2010/0174956 A1 * | 7/2010 | Kawasaki | ...... | G01R 31/318558 714/726 |
| 2014/0047293 A1 * | 2/2014 | Lamb | ..................... | G01R 31/27 714/727 |
| 2014/0136914 A1 * | 5/2014 | Han | ...................... | H03M 1/001 714/727 |
| 2014/0359385 A1 * | 12/2014 | Shah | .................. | G01R 31/3177 714/726 |

FOREIGN PATENT DOCUMENTS

| | | |
|---|---|---|
| JP | 10-072112 | 3/1998 |
| JP | 11-271401 A | 10/1999 |
| JP | 2001-296331 A | 10/2001 |

* cited by examiner

*Primary Examiner* — James C Kerveros
(74) *Attorney, Agent, or Firm* — Harness, Dickey & Pierce, P.L.C.

(57) ABSTRACT

A semiconductor device includes a digital circuit having a scan test mode. The digital circuit includes a first flip-flop forming a part of a scan chain when in the scan test mode, and a first selector provided on an input side of the first flip-flop. The first selector is capable of selecting a first signal when not in the scan test mode, and selecting a second signal that is different from the first signal when in the scan test mode.

11 Claims, 9 Drawing Sheets

SEMICONDUCTOR DEVICE, PHYSICAL QUANTITY SENSOR, ELECTRONIC APPARATUS, AND MOVING OBJECT

BACKGROUND

1. Technical Field

The present invention relates to a semiconductor device, a physical quantity sensor, an electronic apparatus, and a moving object.

2. Related Art

Currently, physical quantity sensors capable of detecting various physical quantities, such as an acceleration sensor that detects acceleration and a gyro sensor that detects angular velocity, are broadly used in various systems and electronic apparatuses. In recent years, very high reliability is required of various physical quantity sensors as these physical sensors are installed on automobiles. To secure high reliability, it is necessary to detect a failure (defect) of a semiconductor device (IC) that processes an output signal from a sensor element, with a probability of almost 100% in the inspection process. As a technique for efficiently detecting a wiring failure (defect) in a digital circuit included in the semiconductor circuit (IC), a scan test is widely known in which flip-flops included in the digital circuit are scanned, a test pattern generated by an ATPG (auto test pattern generation) tool is serially inputted to the scanned flip-flops (scan chain), then the scan chain is canceled so that the digital circuit operates normally, the scan chain is configured again and a signal taken into the flip-flops in normal operation is serially outputted outside, and the signal is compared with an expected value to determine whether there is a failure or not. In a scan test, a failure detection rate of approximately 90% is easily achieved. However, a certain measure needs to be taken in order to achieve a failure detection rate closer to 100%. For example, the failure detection rate can be made closer to 100% by inserting observation flip-flops into all the nodes where a logical change cannot be detected despite its presence. However, this technique leads to a significant increase in circuit scale due to the insertion of a large number of flip-flops.

Meanwhile, JP-A-11-271401 proposes a technique in which, when a scan test is carried out, the logic state in another combinational circuit is taken into a flip-flop for forming a shift register in a sequential circuit to be a test target. According to this technique, a flip-flop for forming a shift register is used as an observation flip-flop at the time of the scan test, without adding a new flip-flop. Therefore, the failure detection rate can be improved while an increase in circuit scale can be restrained.

However, the technique disclosed in JP-A-11-271401 lacks versatility because a flip-flop used as an observation flip-flop is limited to a flip-flop forming a shift register. Moreover, in the technique of JP-A-11-271401, in addition to a scan selection signal that causes a flip-flop to operate as a scan circuit shift register, a scan mode signal for supplementary observation operation in order to take in the logic state in a combinational circuit to be observed in the test needs to be additionally provided, and the selection logic of the input signal and the control signal of the selector need to be changed between the flip-flop forming the shift register and the other flip-flops. Therefore, the scan test design becomes complicated, leading to design errors.

SUMMARY

An advantage of some aspects of the invention is that a semiconductor device, a physical quantity sensor, an electronic apparatus and a moving object in which the failure detection rate can be improved while restraining an increase in circuit scale can be provided by using a technique with high versatility that enables an easier scan test design.

The invention can be implemented as the following forms or application examples.

APPLICATION EXAMPLE 1

This application example is directed to a semiconductor device including a digital circuit having a scan test mode. The digital circuit includes a first flip-flop forming a part of a scan chain when in the scan test mode, and a first selector provided on an input side of the first flip-flop and capable of selecting a first signal when not in the scan test mode, and capable of selecting a second signal that is different from the first signal when in the scan test mode.

The "scan chain" may be one scan chain extending from one input terminal to one output terminal or may be plural scan chains extending from separate input terminals to separate output terminals respectively.

The "first selector" provided on the input side of the first flip-flop may be a selector provided immediately before the input terminal of the first flip-flop or may be selector provided at a stage preceding the input terminal of the first flip-flop with a logic circuit arranged in-between.

The expression "capable of selecting a second signal" includes the case where the second signal is always selected and the case where the second signal is selected only if a predetermined condition is met.

According to the semiconductor device of this application example, the first selector selects the second signal at the time of the scan test mode. Therefore, the second signal (including a signal resulting from the second signal propagating through a logic circuit) can be held at the first flip-flop. Since the first flip-flop is a flip-flop forming a part of the scan chain, an output signal from the first flip-flop can be observed from outside. Thus, by setting a signal that is impossible or difficult to observe from outside, as the second signal, or by setting a signal that can be set from outside as the second signal when the first signal is impossible or difficult to set from outside, the defection failure rate of the digital circuit can be improved.

Also, according to the semiconductor circuit of this application example, a flip-flop that functions in a normal operation mode is used as the first flip-flop. Therefore, a dedicated observation flip-flop for the scan test mode need not be added. Since it suffices to add a selector with a significantly smaller circuit area than the flip-flop, an increase in circuit scale can be restrained.

This technique for improving the defect failure rate is highly versatile since an arbitrary flip-flop forming the scan chain can be selected as the first flip-flop. Also, if there are plural first selectors, a common control signal can be used for the first selectors and therefore the test design can be made easier.

APPLICATION EXAMPLE 2

In the semiconductor device according to the application example described above, the digital circuit may include a second flip-flop that forms a part of the scan chain when in the scan test mode and that outputs an output signal of the second flip-flop as the second signal, and the semiconductor device may include at least one logic element provided in a signal path extending from an output of the first selector to an input of the first flip-flop.

According to the semiconductor device of this application example, since the second flip-flop is a flip-flop forming a part of the scan chain, an arbitrary signal can be set to the second flip-flop from outside. Therefore, even if the first signal is impossible or difficult to set from outside, failure detection in the logic element on the signal path extending from the output of the first selector to the input of the first flip-flop can be carried out by using an output signal from the second flip-flop as the second signal. Thus, the failure detection rate of the digital circuit can be improved.

APPLICATION EXAMPLE 3

The semiconductor device according to the application example described above may include an analog circuit having an interface with the digital circuit, and the second signal may be an output signal from the digital circuit to the analog circuit.

According to the semiconductor device of this application example, since an output signal from the digital circuit to the analog circuit is observable from outside, a failure in the logic circuit (combinational circuit) that generates the output signal. Alternatively, the flip-flop that generates an output signal to the analog circuit can be effectively used as a setting flip-flop when in the scan test mode. Therefore, the failure detection rate of the digital circuit can be improved.

APPLICATION EXAMPLE 4

In the semiconductor according to the application example described above, the second signal may be an input signal to a logic element in which a logic level of an output signal is fixed when in the scan test mode.

According to the semiconductor device of this application example, since a signal that is immediately before the logic level is fixed is observable from outside when in the scan test mode, a failure in the logic circuit (combinational circuit) that generates the signal immediately before the logic level is fixed can be detected. Therefore, the failure detection rate of the digital circuit can be improved.

APPLICATION EXAMPLE 5

The semiconductor device according to the application example described above may include an analog circuit having an interface with the digital circuit, and the first signal may be an input signal to the digital circuit from the analog circuit.

According to the semiconductor device of this application example, a failure in the logic circuit (combinational circuit) to which an input signal from the analog circuit to the digital circuit is inputted can be detected. Alternatively, the flip-flop to which an input signal from the analog circuit to the digital circuit is directly inputted can be effectively used as an observation flip-flop when in the scan test mode. Therefore, the failure detection rate of the digital circuit can be improved.

APPLICATION EXAMPLE 6

In the semiconductor device according to the application example described above, the first signal may be a signal in which a logic level is fixed when in the scan test mode.

According to the semiconductor device of this application example, since the propagation to the subsequent circuit of a signal in which the logic level is fixed is stopped at the first selected when in the scan test mode and the second signal is inputted instead of the first signal, a failure in the subsequent circuit can be detected. Therefore, the failure detection rate of the digital circuit can be improved.

APPLICATION EXAMPLE 7

In the semiconductor device according to the application example described above, the first selector may constantly select the second signal when in the scan test mode.

According to the semiconductor device of this application example, since a setting signal for the scan test mode can be a control signal for the first selector, the scan test design can be made easier.

APPLICATION EXAMPLE 8

In the semiconductor device according to the application example described above, the digital circuit may include a third flip-flop that forms a part of the scan chain when in the scan test mode, and the first selector may select the first signal or the second signal in response to an output signal from the third flip-flop when in the scan test mode.

Since the third flip-flop is a flip-flop that forms a part of the scan chain, an arbitrary signal can be set to the third flip-flop from outside. Thus, when in the scan test mode, the first selector can select not only the second signal but also the first signal. Therefore, not only failure detection in the logic circuit (combinational circuit) that generates the second signal but also failure detection in the logic circuit (combinational circuit) that generates the first signal can be carried out. Thus, even if there is only the logic circuit (combinational circuit) that generates the first signal, a fall in the failure detection rate due to the provision of the first selector can be avoided.

APPLICATION EXAMPLE 9

In the semiconductor device according to the application example described above, the second signal may be an output signal from a multiple-input logic circuit that does not function when not in the scan test mode.

According to the semiconductor device of this application example, even if there are many signals that are impossible or difficult to observe from outside and the number of flip-flops that can be used for the first flip-flop is small, the plural signals that are impossible or difficult to observe from outside are inputted to the multiple-input logic circuit, and an output signal from the multiple-input logic circuit is used as the second signal. Thus, the change in logic level of each of the plural signal is propagated into the output from the multiple-input logic circuit and can be observed from outside via the first flip-flop.

The multiple-input logic circuit may be, for example, an EXOR (exclusive-OR or exclusive logical sum) circuit. Since an output from the EXOR circuit changes when an odd number of input signals are changed, the input signals are easily propagated into the output signal. Therefore, as plural signals that are impossible or difficult to observe from outside are inputted to the EXOR circuit, observability can be improved and the test pattern can be shortened, compared with the case where an AND circuit, OR circuit or the like is used.

APPLICATION EXAMPLE 10

In the semiconductor device according to the application example described above, at least a part of input signals to the multiple-input logic circuit may be an output signal from the digital circuit to the analog circuit, or an input signal to a logic element in which a logic level of an output signal is fixed when in the scan test mode.

APPLICATION EXAMPLE 11

This application example is directed to a physical quantity sensor including a sensor element that detects a physical quantity, and one of the foregoing semiconductor devices that generates a signal corresponding to the physical quantity, based on a detection signal from the sensor element.

The physical quantity sensor according to this application example may be, for example, an inertial sensor such as an acceleration sensor, gyro sensor (angular velocity sensor) or velocity sensor, or may be a clinometer that measures an angle of inclination based on gravity.

APPLICATION EXAMPLE 12

This application example is directed to an electronic apparatus including one of the foregoing semiconductor devices.

APPLICATION EXAMPLE 13

This application example is directed to a moving object including one of the foregoing semiconductor devices.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not to unduly limit the content of the invention described in the appended claims. Not all the configurations described below are essential components of the invention.

1. Semiconductor Device
1-1. First Embodiment
Circuit Configuration

Figure 1:
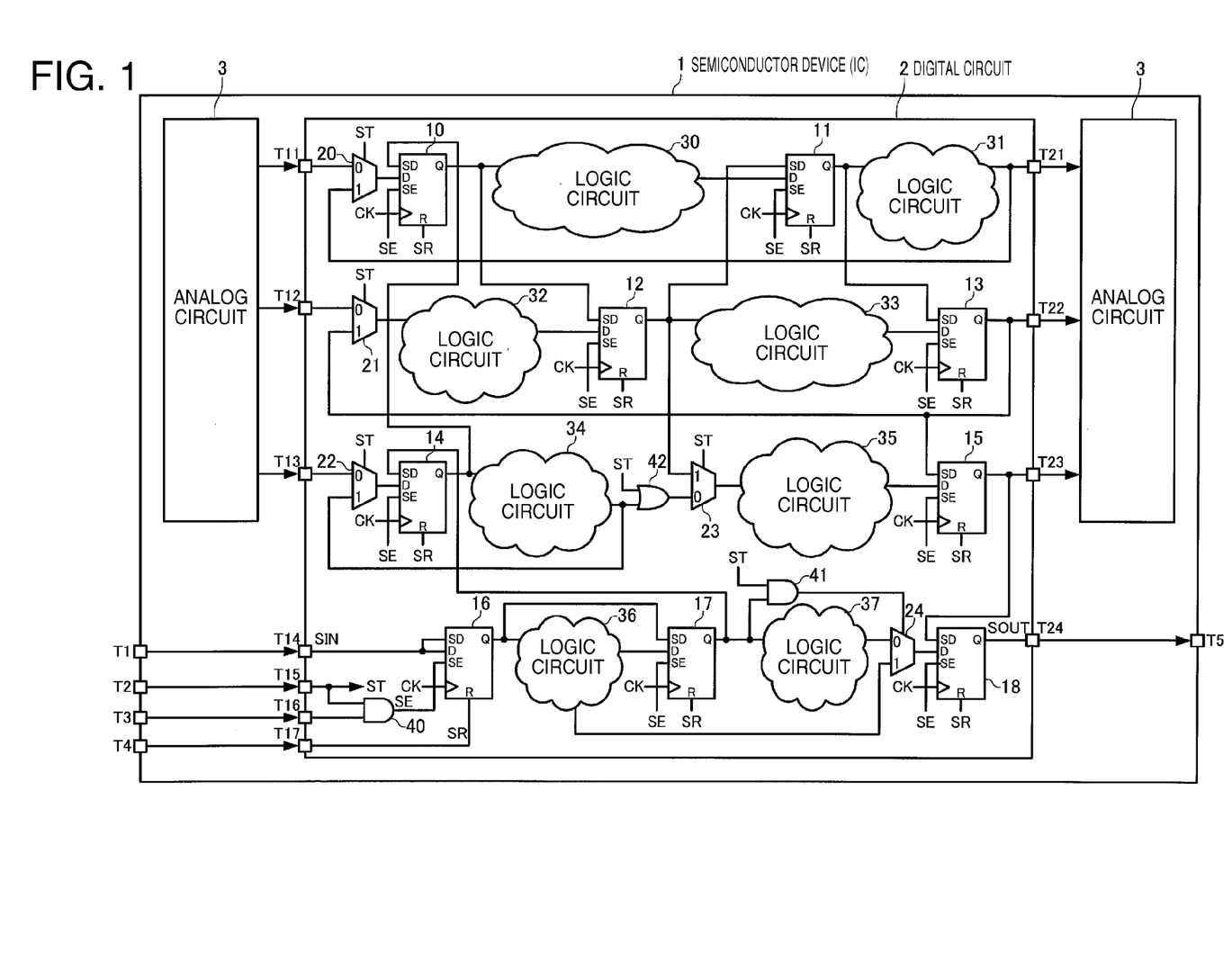
FIG. 1 shows an example of the configuration of a semiconductor device according to a first embodiment.

FIG. 1 shows an example of the configuration of the semiconductor device according to a first embodiment. As shown in FIG. 1, a semiconductor device 1 of the first embodiment includes a digital circuit 2 and analog circuits 3. However, the semiconductor device 1 may not include the analog circuits 3.

The digital circuit 2 is provided with input terminals T11 to T17 and output terminals T21 to T24.

A digital signal outputted from the analog circuit 3 (for example, an output signal from an A/D converter) is inputted to the input terminals T11, T12, T13. The input terminals T14, T15, T16, T17 are electrically connected to external input terminals T1, T2, T3, T4 of the semiconductor device 1, respectively. A digital signal inputted from outside the semiconductor device 1 is inputted to the input terminals T14, T15, T16, T17 via the external input terminals T1, T2, T3, T4.

Digital signals outputted from the output terminals T21, T22, T23 are inputted to the analog circuit 3, for example, as control signals or setting signals. The output terminal T24 is electrically connected to an external output terminal T5 of the semiconductor device 1. A digital signal outputted from the output terminal T24 is outputted outside of the semiconductor device 1 via the external input terminal T5.

The digital circuit 2 includes flip-flops 10 to 18, selectors 20 to 24, logic circuits 30 to 37, AND elements 40, 41, and an OR element 42.

The flip-flops (hereinafter referred to as "FFs") 10 to 18 each have a data input terminal (D terminal), a clock input terminal, a scan data input terminal (SD terminal), a scan enable input terminal (SE terminal), a reset terminal (R terminal), and a data output terminal (Q terminal). However, the FFs 10 to 18 may also include other terminals than these, for example, a reverse data output terminal (QN) or the like.

The FFs 10 to 18 hold a signal inputted to the D terminal and outputs the signal from the Q terminal when a scan enable signal SE inputted to the SE terminal is at low level, at a riding edge of a clock signal CK inputted to the clock terminal. The FFs 10 to 18 holds a signal inputted to the SD terminal and outputs the signal from the Q terminal when the scan enable signal SE is at high level. When a scan reset signal SR inputted to the R terminal is at high level, the FFs 10 to 18 are asynchronously reset and the signal outputted from the Q terminal falls to low level.

The selectors 20 to 24 each have a first input terminal (0), a second input terminal (1), a control terminal, and an output terminal. When a control signal inputted from the control terminal is at low level, a signal inputted from the first input terminal is selected and outputted from the output terminal. When the control signal is at high level, a signal inputted from the second input terminal is selected and outputted from the output terminal.

The digital circuit 2 is set to a scan test mode when a scan test signal ST inputted from the external input terminal T2 via the input terminal T15 is at high level, and set to another mode than the scan test mode (normal operation mode or the like) when the scan test signal ST is at low level.

Signal Propagation Path in Normal Operation Mode

Figure 2:
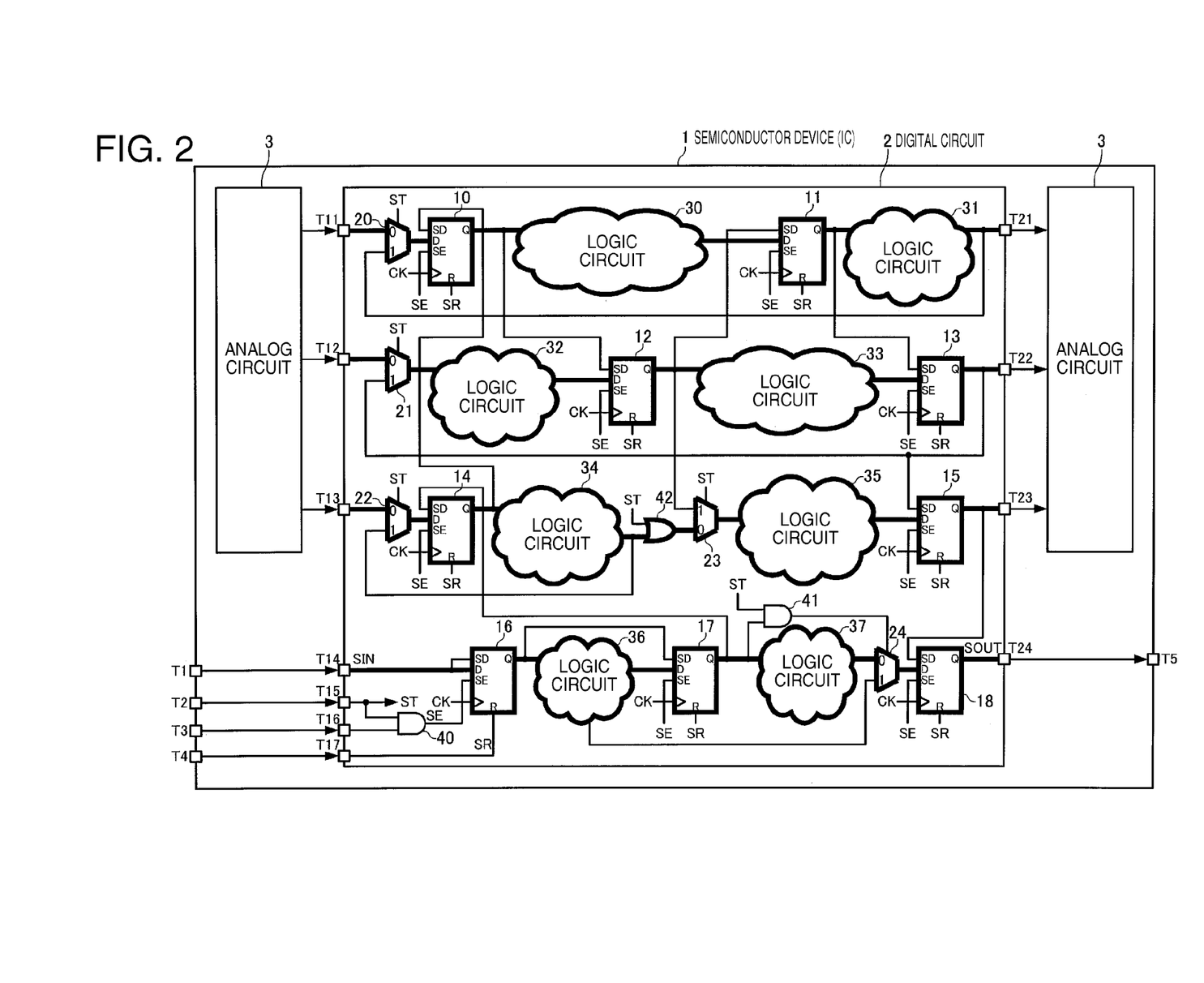
FIG. 2 is an explanatory view of a signal propagation path in a normal operation mode.

FIG. 2 illustrates the signal propagation path in the normal operation mode. In FIG. 2, the signal propagation path in the normal operation mode is indicated by bold lines.

As shown in FIG. 2, a signal inputted from the analog circuit 3 to the digital circuit 2 via the input terminal T11 propagates through the selector 20 and is inputted to the D terminal of the FF 10 and held in the FF 10 at a rising edge of the clock signal CK.

The output signal from the FF 10 is inputted to the logic circuit 30 and propagates into the output of the logic circuit 30 via one or plural logic elements. The output signal from the logic circuit 30 is inputted to the D terminal of the FF 11 and held in the FF 11 at a rising edge of the clock signal CK.

The output signal from the FF 11 is inputted to the logic circuit 31 and propagates into the output of the logic circuit 31 via one or plural logic elements. The output signal from the logic circuit 31 is outputted to the analog circuit 3 via the output terminal T21.

A signal inputted from the analog circuit 3 to the digital circuit 2 via the input terminal T12 propagates through the selector 21 and is inputted to the logic circuit 32. The signal inputted to the logic circuit 32 propagates into the output of the logic circuit 32 via one or plural logic elements. The output signal from the logic circuit 32 is inputted to the D terminal of the FF 12 and held in the FF 12 at a rising edge of the clock signal CK.

The output signal from the FF 12 is inputted to the logic circuit 33 and propagates into the output of the logic circuit 33 via one or plural logic elements. The output signal from the logic circuit 33 is inputted to the D terminal of the FF 13 and held in the FF 13 at a rising edge of the clock signal CK. The output signal from the FF 13 is outputted to the analog circuit 3 via the output terminal T22.

A signal inputted from the analog circuit 3 to the digital circuit 2 via the input terminal T13 propagates through the selector 22 and is inputted to the D terminal of the FF 14 and held in the FF 14 at a rising edge of the clock signal CK.

The output signal from the FF 14 is inputted to the logic circuit 34 and propagates into the output of the logic circuit 34 via one or plural logic elements. The output signal from the logic circuit 34 propagates through the OR element 42 and the selector 23, is inputted to the logic circuit 35, and propagates into the output of the logic circuit 35 via one or plural logic elements. The output signal from the logic circuit 35 is inputted to the D terminal of the FF 15 and held in the FF 15 at a rising edge of the clock signal CK. The output signal from the FF 15 is outputted to the analog circuit 3 via the output terminal T23.

A signal inputted from the external input terminal T1 to the digital circuit 2 via the input terminal T14 is inputted to the D terminal of the FF 16 and held in the FF 16 at a rising edge of the clock signal CK.

The output signal from the FF 16 is inputted to the logic circuit 36 and propagates into the output of the logic circuit 36 via one or plural logic elements. The output signal from the logic circuit 36 is inputted to the D terminal of the FF 17 and held in the FF 17 at a rising edge of the clock signal CK.

The output signal from the FF 17 is inputted to the logic circuit 37 and propagates into the output of the logic circuit 37 via one or plural logic elements. Since the scan test signal ST is at low level, the output signal from the AND element 41 is fixed at low level. Therefore, the output signal from the logic circuit 37 propagates through the selector 24 and is inputted to the D terminal of the FF 18 and held in the FF 18 at a rising edge of the clock signal CK. The output signal from the FF 18 is outputted to outside from the external output terminal T5 via the output terminal T24.

Signal Propagation Path in Scan Test Mode

In the scan test mode (when the scan test signal ST is at high level), a signal inputted to the digital circuit 2 from the external input terminal T3 via the input terminal T16 propagates the AND element 40 and is inputted to the SE terminals of the FFs 10 to 18 as a scan enable signal SE. A signal inputted from the external input terminal T4 via the input terminal T17 is inputted to a scan reset signal SR and then to the R terminals of the FFs 10 to 18.

Figure 3:
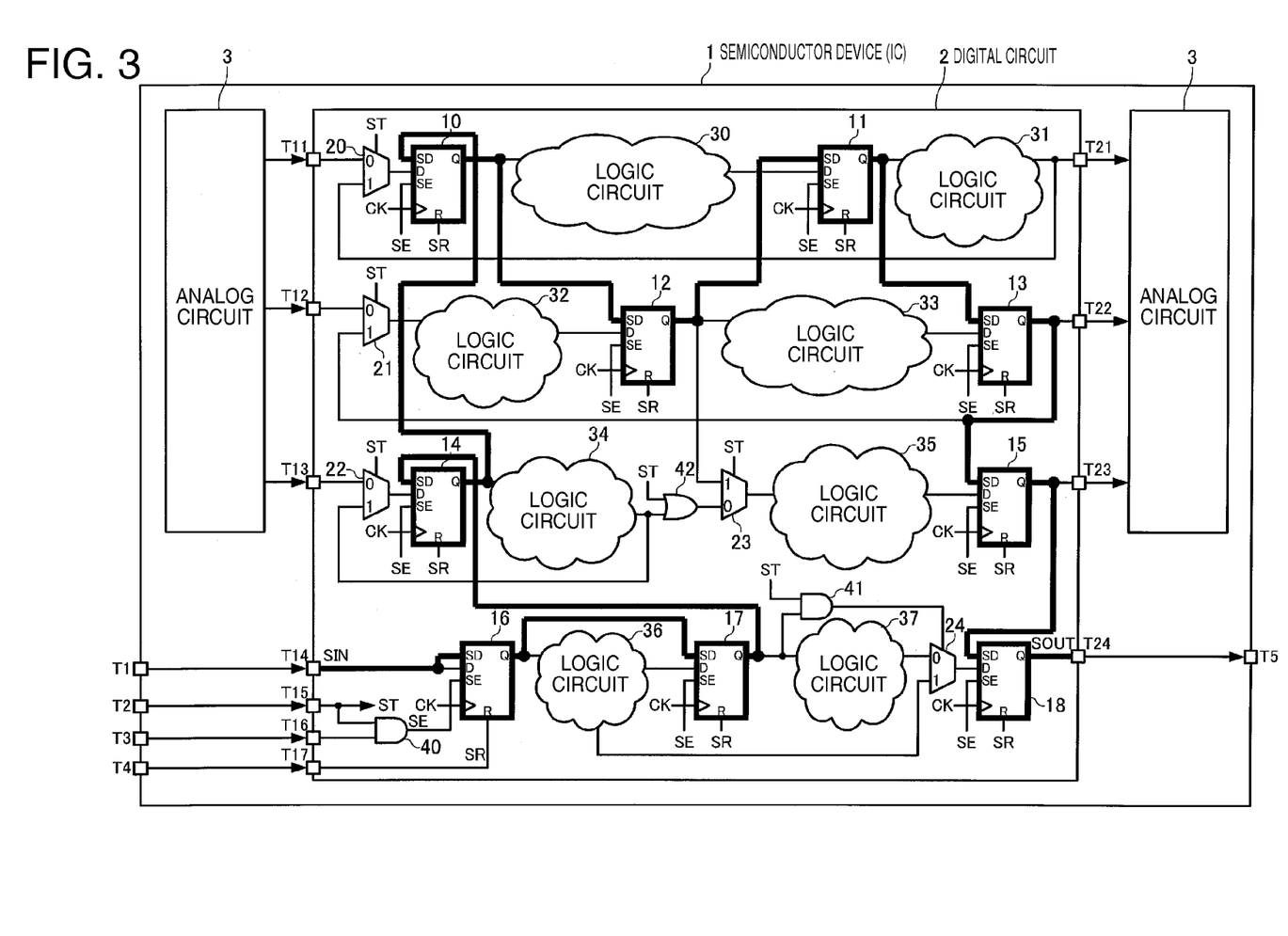
FIG. 3 is an explanatory view of a signal propagation path when a scan enable signal is at high level in a scan test mode.

FIG. 3 illustrates the signal propagation path when the scan enable signal is at high level in the scan test mode. In FIG. 3, the signal propagation path when the scan enable signal is at high level in the scan test mode is indicated by bold lines.

A signal inputted to the digital circuit 2 from the external input terminal T1 via the input terminal T14 is inputted to the SD terminal of the FF 16 and held in the FF 16 at a rising edge of the clock signal CK.

The output signal from the FF 16 is inputted to the SD terminal of the FF 17 and held in the FF 17 at a rising edge of the clock signal CK. The output signal from the FF 17 is inputted to the SD terminal of the FF 14 and held in the FF 14 at a rising edge of the clock signal CK. The output signal from the FF 14 is inputted to the SD terminal of the FF 10 and held in the FF 10 at a rising edge of the clock signal CK. The output signal from the FF 10 is inputted to the SD terminal of the FF 12 and held in the FF 12 at a rising edge of the clock signal CK. The output signal from the FF 12 is inputted to the SD terminal of the FF 11 and held in the FF 11 at a rising edge of the clock signal CK. The output signal from the FF 11 is inputted to the SD terminal of the FF 13 and held in the FF 13 at a rising edge of the clock signal CK. The output signal from the FF 13 is inputted to the SD terminal of the FF 15 and held in the FF 15 at a rising edge of the clock signal CK. The output signal from the FF 15 is inputted to the SD terminal of the FF 18 and held in the FF 18 at a rising edge of the clock signal CK. The output signal from the FF 18 is outputted to outside from the external output terminal T5 via the output terminal T24.

Therefore, when the scan enable signal SE is at high level in scan test mode, a scan in signal SIN inputted from the external input terminal T1 propagates in order of the FF 16, FF 17, FF 14, FF 10, FF 12, FF 11, FF 13, FF 15, and FF 18, at nine rising edges of the clock signal CK. Also, the respective output signals from the FF 18, FF 15, FF 13, FF 11, FF 12, FF 10, FF 14, FF 17, and FF 16 are outputted in this order to outside from the external output terminal T5 as a scan out signal SOUT, at eight rising edges of the clock signal CK. That is, when the scan enable signal SE is at high level, low level or high level can be separately set for each of the FFs 10 to 18 from the external input terminal T1, and at the same time as this setting, a scan chain in which signals held in the FFs 10 to 18 can be observed from the external output terminal T5 is formed.

Figure 4:
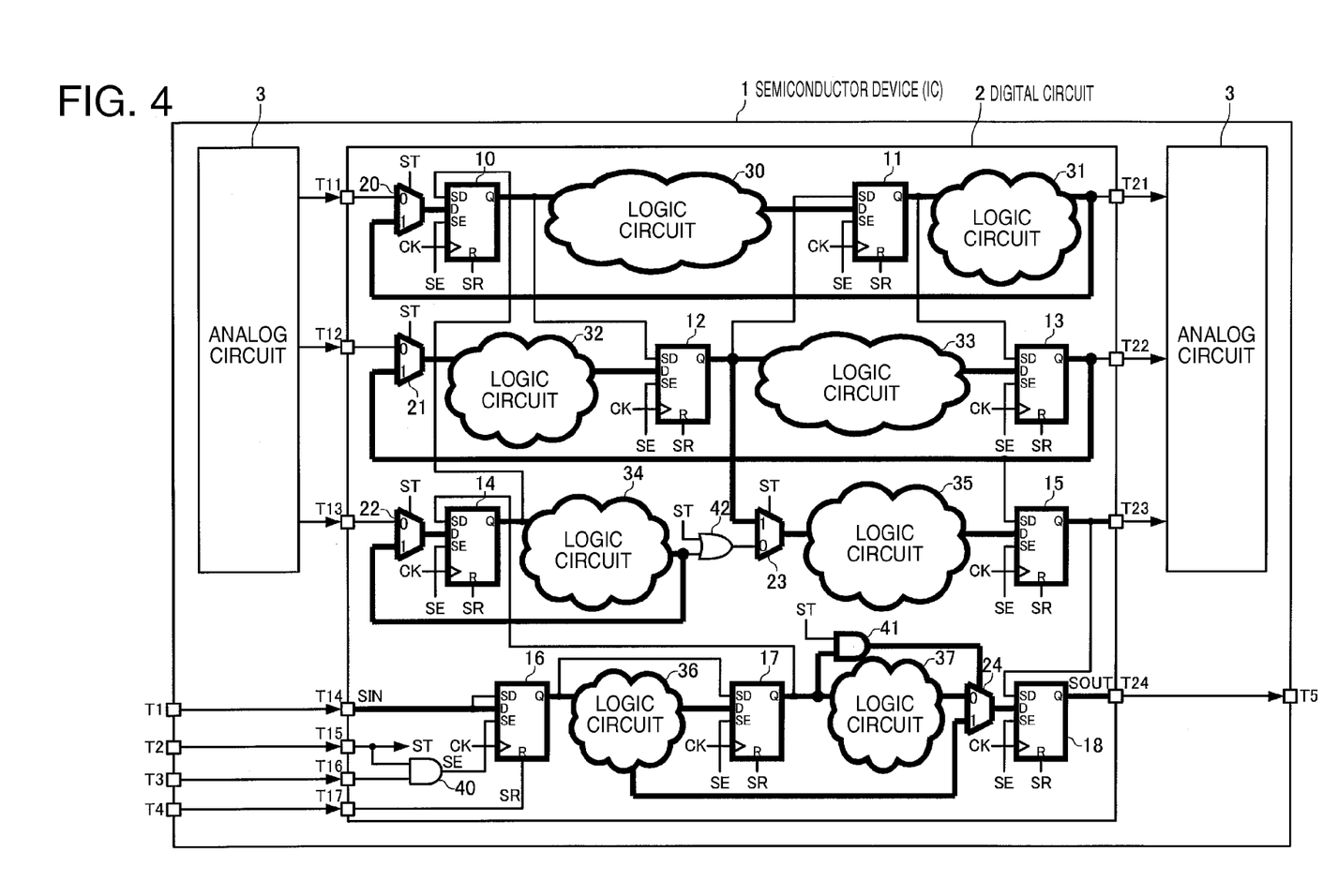
FIG. 4 is an explanatory view of a signal propagation path when a scan enable signal is at low level in a scan test mode.

FIG. 4 illustrates the signal propagation path when the scan enable signal is at low level in the scan test mode. In FIG. 4, the signal propagation path when the scan enable signal is at low level in the scan test mode is indicated by bold lines.

As shown in FIG. 4, the output signal from the logic circuit 31 propagates to the D terminal input of the FF 10 via the selector 20 and is held in the FF 10 at a rising edge of the clock signal CK.

The output signal from the FF 13 propagates to the input of the logic circuit 32 via the selector 21 and propagates into the output of the logic circuit 32 via one or plural logic elements.

The output signal from the logic circuit 34 propagates to the D terminal input of the FF 14 via the selector 22 and is held in the FF 14 at a rising edge of the clock signal CK.

The output signal from the FF 12 propagates to the input of the logic circuit 35 via the selector 23 and propagates into the output of the logic circuit 35 via one or plural logic elements.

The output signal from the FF 17 propagates through the AND element 41 and is inputted to the control terminal of the selector 24.

When the output signal from the AND element 41 is at low level, the output signal from the logic circuit 37 propagates to the D terminal input of the FF 14 via the selector 24. When the output signal from the AND element 41 is at high level, a signal from a predetermined node included in the logic circuit 36 propagates.

Since the scan test signal ST is at high level, the output signal from the logic circuit 34 cannot propagate through the OR element 42 and the output signal from the OR element 42 is fixed at high level.

The other parts of the signal propagation path when the scan enable signal is at low level in the scan test mode are the same as the signal propagation path in the normal operation mode shown in FIG. 2 and therefore will not be described further in detail.

Figure 5:
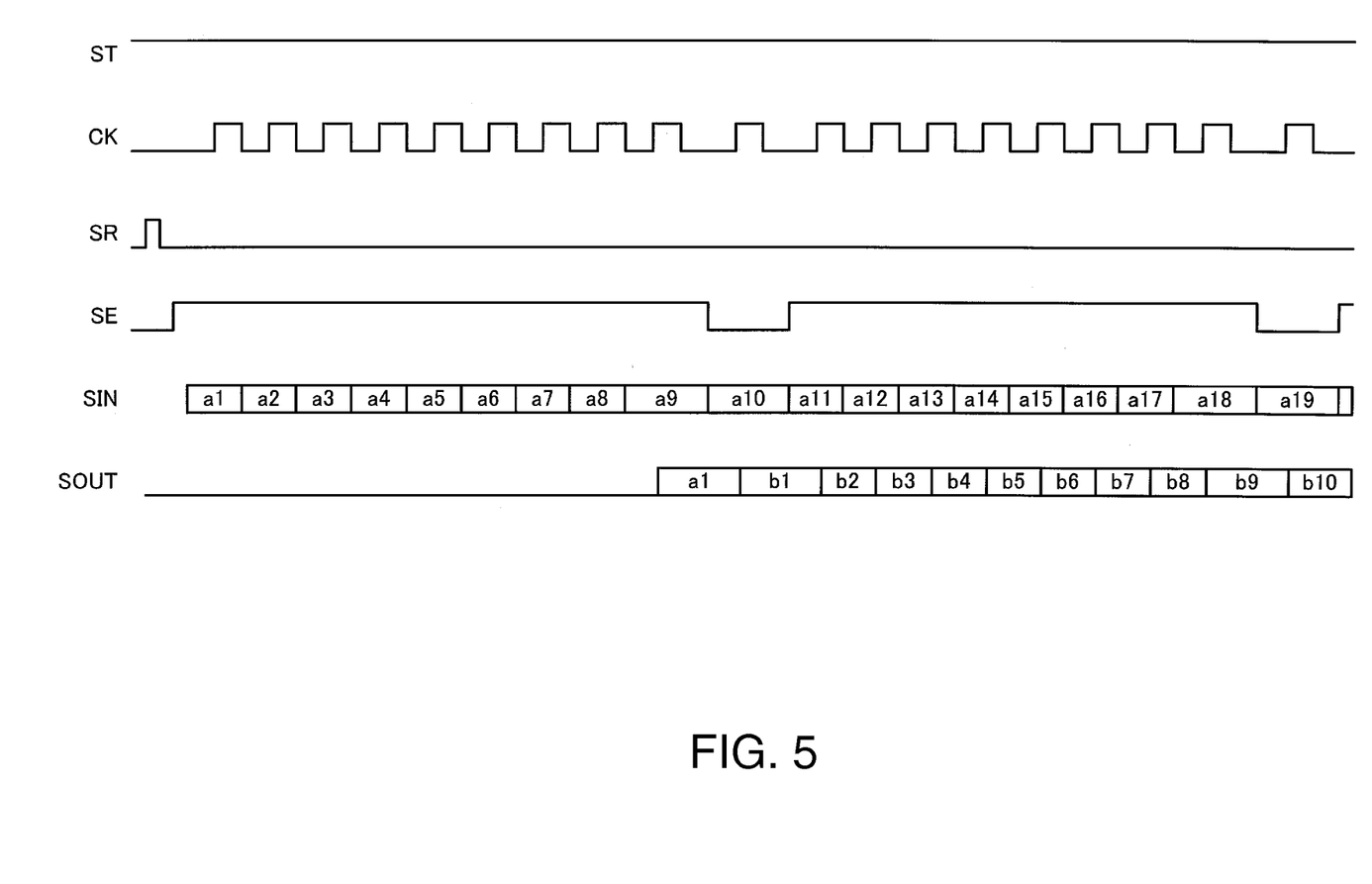
FIG. 5 shows an outline of a test pattern in a scan test.

FIG. 5 shows an outline of a test pattern in a scan test. In this embodiment, as shown in FIG. 5, the scan test signal ST is constantly set at high level when a scan test is carried out.

First, both the clock signal CK and the scan enable signal SE are set at low level and a high-level pulse is inputted as the scan reset signal SR. Thus, all the flip-flops FF 10 to FF 18 forming the scan chain are reset and the scan out signal falls to low level.

Next, the scan enable signal SE is set at high level and the clock signal CK corresponding to nine clocks is inputted. Since the scan enable signal SE is at high level, a scan chain is formed and low-level signals outputted respectively from the FF 18, FF 15, FF 13, FF 11, FF 12, FF 10, FF 14, FF 17, and FF 16 are outputted to outside in this order as the scan out signal SOUT, synchronously with the clock signal CK corresponding to nine clocks. Also, high-level or low-level signals a1 to a9 are inputted in order as the scan in signal SIN, synchronously with the clock signal CK corresponding to nine clocks. Therefore, when the input of the clock signal CK corresponding to nine clocks is finished, the signals a1 to a9 are held respectively in the FF 18, FF 15, FF 13, FF 11, FF 12, FF 10, FF 14, FF 17, and FF 16.

Next, after the scan enable signal SE is set at low level, the clock signal CK is inputted. Since the scan enable signal SE is at low level, the scan chain is canceled and the respective output signals a2 to a9 from the FF 15, FF 13, FF 11, FF 12, FF 10, FF 14, FF 17, and FF 16 propagate through one of the logic circuits 30 to 37 and are held in the subsequent flip-flops at a rising edge of the clock signal CK. Thus, an output signal b1 from the FF 18 is outputted to outside as the scan out signal SOUT. Also, a signal a10 is held in the FF 16 at a rising edge of this clock signal CK.

Next, the scan enable signal SE is set at high level again and the clock signal CK corresponding to eight clocks is inputted. Since the scan enable signal SE is at high level, a scan chain is formed and respective output signals b2 to b9 from the FF 15, FF 13, FF 11, FF 12, FF 10, FF 14, FF 17, and FF 16 are outputted to outside in this order as the scan out signal SOUT, synchronously with the clock signal CK corresponding to eight clocks. Also, high-level or low-level signals a11 to a18 are inputted in order as the scan in signal SIN, synchronously with the clock signal CK corresponding to eight clocks. Therefore, when the input of the clock signal CK corresponding to eight clocks is finished, the signals a10 to a18 are held respectively in the FF 18, FF 15, FF 13, FF 11, FF 12, FF 10, FF 14, FF 17, and FF 16.

Next, after the scan enable signal SE is set at low level again, the clock signal CK is inputted. Since the scan enable signal SE is at low level, the scan chain is canceled and the respective output signals a11 to a18 from the FF 15, FF 13, FF 11, FF 12, FF 10, FF 14, FF 17, and FF 16 propagate through one of the logic circuits 30 to 37 and are held in the subsequent flip-flops at a rising edge of the clock signal CK. Thus, an output signal b10 from the FF 18 is outputted to outside as a scan out signal SOUT. Also, a signal a19 is held in the FF 16 at a rising edge of this clock signal CK.

Subsequently, the pattern of setting the scan enable signal SE set at high level and inputting the clock signal CK corresponding to eight clocks while changing the input pattern of the scan in signal SIN, and then setting the scan enable signal SE at low level and inputting the clock signal CK by one clock, is repeated. Then, the pattern of the scan out signal SOUT is compared with an expected value of an output pattern that should be obtained in connection with the input pattern of the scan in signal SIN. If the pattern does not match the expected value even by one bit, it can be determined that there is a failure in the digital circuit 2.

In this embodiment, the digital circuit 2 can be set to the normal operation mode or the scan test mode, according to the level of the scan test signal ST inputted from the external input terminal T2. However, for example, a mode setting register and an interface circuit for setting a value in the mode setting register from outside may be provided in the digital circuit 2, so as to enable the setting of the normal operation mode or the scan test mode by setting a desired value in the mode setting register.

Explanation of Improvement Principles for Failure Detection Rate

In this embodiment, in order to improve the failure detection rate of the digital circuit 2, the selectors 20 to 24 are provided and the signal path for propagation through the selectors 20 to 24 in the scan test mode is made different from the signal path in the normal operation mode. Hereinafter, the reasons for the improvement in the failure detection rate based on the provision of the selectors 20 to 24 will be described in detail in terms of each of the selectors.

Reason for Providing Selector 20

In the normal operation mode, the output signal from the logic circuit 31 is outputted to the analog circuit 3 via the output terminal T21 without being held in any flip-flop and is not outputted from any external output terminal of the semiconductor device 1. Therefore, if a scan test is carried out without taking any measures for the circuit, the output signal from the logic circuit 31 cannot be monitored from outside and a failure in a part or the whole of the nodes in the logic circuit 31 cannot be detected. Thus, in this embodiment, the selector 20 (an example of the first selector) which selects the signal inputted from the input terminal T11 (an example of the first signal) when the scan test signal ST is at low level (when not in the scan test mode) and which selects the output signal from the logic circuit 31 (an example of the second signal) when the scan test signal ST is at high level (when in the scan test mode) is provided before the FF 10 (an example of the first flip-flop). That is, in the scan test mode, when the scan enable signal SE is at low level, the output signal from the logic circuit 31 is held in the FF 10 at a rising edge of the clock signal CK. Since the FF 10 forms a part of the scan chain, the output signal from the logic circuit 31 can be monitored from outside by doing a scan test. Therefore, the failure detection rate of the logic circuit 31 is improved.

Reason for Providing Selector 21

In the scan test mode, the operation of the analog circuit 3 is stopped for the purpose of detecting a failure at each node in the digital circuit 2. The signal inputted to the digital circuit 2 from the analog circuit 3 via the input terminal T12 is fixed at low level or high level. Therefore, if a scan test is carried out without taking any measures for the circuit, the failure detection rate of the logic circuit 32 falls. Thus, in this embodiment, the selector 21 (an example of the first selector) which selects the signal inputted from the input terminal T12 (an example of the first signal) when the scan test signal ST is at low level (when not in the scan test mode) and which selects the output signal (an example of the second signal) from the FF 13 (an example of the second flip-flop) when the scan test signal ST is at high level (when in the scan test mode) is provided before the logic circuit 32. That is, in the scan test mode, when the scan enable signal SE is at low level, the output signal from the FF 13 is inputted to logic circuit 32, instead of the signal inputted from the input terminal T12, and the output signal from the logic circuit 32 is held in the FF 12 (an example of the first flip-flop) at a rising edge of the clock signal CK. Since the FF 12 and FF 13 form a part of the scan chain, the input signal to the logic circuit 32 can be arbitrarily set and the output signal from the logic circuit 32 can be monitored from outside by doing a scan test. Therefore, the failure detection rate of the logic circuit 32 is improved.

Reason for Providing Selector 22

The output signal from the logic circuit 34 and the scan test signal ST are inputted to the OR element 42. When in the scan test mode (when the scan test signal ST is at high level), the output signal from the OR element 42 is fixed at high level. Therefore, if a scan test is carried out without taking any measures for the circuit, the output signal from the logic circuit 34 (with a variable logic level) cannot be monitored from outside and the failure detection rate of the logic circuit 34 falls. Thus, in this embodiment, the selector 22 (an example of the first selector) which selects the signal inputted from the input terminal T13 (an example of the first signal) when the scan test signal ST is at low level (when not in the scan test mode) and which selects the output signal from the logic circuit 34 (an example of the second signal) when the scan test signal ST is at high level (when in the scan test mode) is provided before the FF 14 (an example of the first flip-flop). That is, in the scan test mode, when the scan enable signal SE is at low level, the output signal from the logic circuit 34 is held in the FF 14 at a rising edge of the clock signal CK, instead of the signal inputted from the input terminal T12. Since the FF 14 forms a part of the scan chain, the output signal from the logic circuit 34 can be monitored from outside by doing a scan test. Therefore, the failure detection rate of the logic circuit 34 is improved.

Reason for Providing Selector 23

Also, in the normal operation mode, the scan test signal ST is at low level and therefore the output signal from the logic circuit 34 propagates through the OR element 42 and is inputted to the logic circuit 35, whereas in the scan test mode (when the scan test signal ST is at high level), the input signal to the logic circuit 35 is fixed at high level by the OR element 42. Therefore, if a scan test is carried out without taking any measures for the circuit, the failure detection rate of the logic circuit 35 falls. Thus, in this embodiment, the selector 23 (an example of the first selector) which selects the output signal from the OR element 42 (an example of the first signal) when the scan test signal ST is at low level (when not in the scan test mode) and which selects the output signal (an example of the second signal) from the FF 12 (an example of the second flip-flop) when the scan test signal ST is at high level (when in the scan test mode) is provided before the logic circuit 35. That is, in the scan test mode, when the scan enable signal SE is at low level, the output signal from the FF 12 is inputted to logic circuit 35, instead of the output signal from the OR element 42, and the output signal from the logic circuit 35 is held in the FF 15 (an example of the first flip-flop) at a rising edge of the clock signal CK. Since the FF 12 and FF 15 form a part of the scan chain, the input signal to the logic circuit 35 can be arbitrarily set and the output signal from the logic circuit 35 can be monitored from outside by doing a scan test. Therefore, the failure detection rate of the logic circuit 35 is improved.

Reason for Providing Selector 24

In the scan test mode, when a part of the nodes in the logic circuit 36 is fixed at high level or low level, if a scan test is carried out without taking any measures for the circuit, the failure detection rate falls in the circuit part that precedes the node. Thus, in this embodiment, the selector 22 (an example of the first selector) which selects the output signal from the logic circuit 37 (an example of the first signal) when the output signal from the AND element 41 is at low level (when not in the scan test mode) and which selects the signal from a predetermined node with a variable logic level (an example of the second signal) that is immediately before the node where the logic level of the logic circuit 36 is fixed, when the output signal from the AND element 41 is at high level (when in the scan test mode), is provided before the FF 18 (an example of the first flip-flop). When the scan test signal ST is at a low level (when not in the scan test mode), the output signal from the AND element 41 is at low level. When the scan test signal ST is at high level (when in the scan test mode), the output signal from the FF 17 (an example of the third flip-flop) propagates to the output of the AND element 41. That is, in the scan test mode, when the scan enable signal SE is at low level, one of the output signal from the logic circuit 37 and the signal from a predetermined node in the logic circuit 36 is held in the FF 18 at a rising edge of the clock signal CK, according to the logic level of the output signal from the FF 17. Since the FF 17 forms a part of the scan chain, the output signal from the FF 17, that is, the control signal of the selector 24 in the scan test mode, can be freely set at high level or low level from the external input terminal T1. Moreover, since the FF 18 forms a part of the scan chain, the one of the output signal from the logic circuit 37 and the signal from the predetermined node in the logic circuit 36 can be monitored from outside by doing a scan test. Therefore, the failure detection rate of the logic circuit 36 and the logic circuit 37 is improved. If the control signal of the selector 24 is fixed to the scan test signal ST, as in the selectors 20 to 23, the selector 24 constantly selects the signal from the predetermined node in the logic circuit 36 when in the scan test mode, and failure detection cannot be carried out in the logic circuit 37. However, by using the output signal from the FF 17 propagated through the AND element 41 as the control signal of the selector 24, it is possible to carry out failure detection in the logic circuit 37.

As described above, according to the semiconductor device of the first embodiment, when in the scan test mode, the selectors 20, 22 and 24 respectively select a signal that is impossible or difficult to observe from outside, and the signal can be held in the FF 10, FF 14 and FF 18 forming a part of the scan chain. Therefore, the failure detection rate of the digital circuit 2 can be improved.

Also, according to the semiconductor device of the first embodiment, when in the scan test mode, the selector 21 selects the output signal from the FF 13 forming a part of the scan chain, and the output signal from the logic circuit 32 can be held in the FF 12 forming a part of the scan chain. Therefore, the failure detection rate of the digital circuit 2 can be improved.

Moreover, according to the semiconductor device of the first embodiment, when in the scan test mode, the selector 23 selects the output signal from the FF 12 forming a part of the scan chain, instead of the output signal from the OR element 42 that is fixed at high level. Therefore, failure detection in the logic circuit 35 can be carried out and the failure detection rate of the digital circuit 2 can be improved.

In this way, according to the semiconductor device of the first embodiment, it is not necessary to add a dedicated flip-flop for observation in the scan test mode, and it suffices to add the selectors 20 to 24 with a significantly smaller circuit area than a flip-flop. Therefore, an increase in circuit scale can be restrained.

This technique for improving the failure detection rate is highly versatile because a selector can be provided on the input side of an arbitrary flip-flop forming the scan chain. Also, since a common control signal can be used for selectors, the test design can be made easier.

1-2. Second Embodiment

In the first embodiment, for example, if there are more output signals from the digital circuit 2 to the analog circuit 3 than input signals from the analog circuit 3 to the digital circuit 2, when in the scan test mode, the respective output signals cannot be separately inputted to the selectors provided on the input side of the flip-flops to which the input signals are inputted respectively in the normal operation mode. Thus, in a second embodiment, a multiple-input logic circuit is provided to which plural signals to be monitored when in the scan test mode are inputted, and an output signal from the multiple-input logic circuit is inputted to a selector. The multiple-input logic circuit is provided for the scan test mode and does not function (does not contribute to the operation of the digital circuit 2 in the normal operation mode) when not in the scan test mode (when in the normal operation mode). The input signals to the multiple-input logic circuit are, for example, the output signals from the digital circuit 3 to the analog circuit 2, or the input signals of logic elements having variable input signal logic levels and fixed output signal logic levels when in the scan test mode, or the like.

Figure 6:
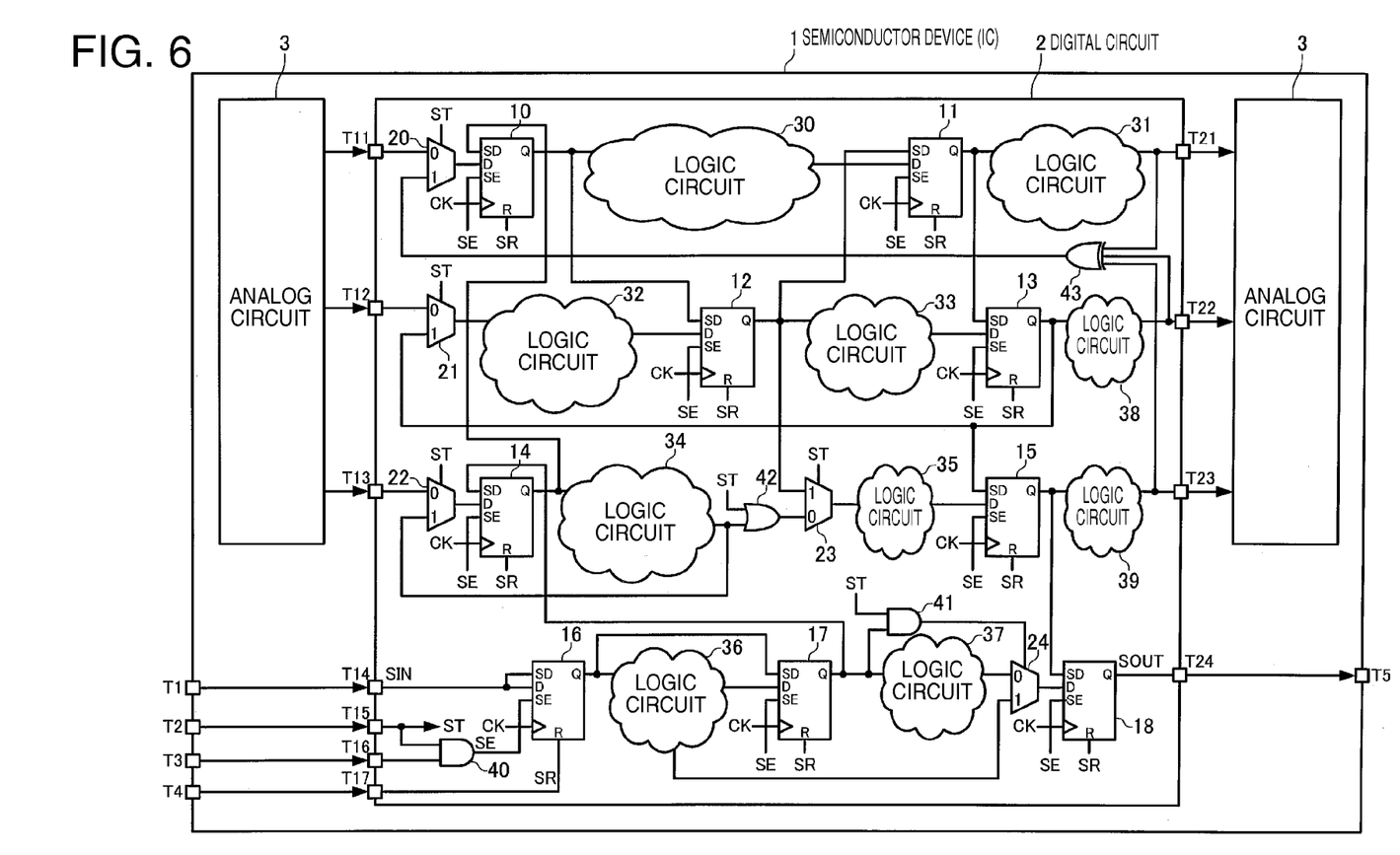
FIG. 6 shows an example of the configuration of a semiconductor device according to a second embodiment.

FIG. 6 shows an example of a configuration of a semiconductor device according to the second embodiment. In FIG. 6, the same components as in FIG. 1 are denoted by the same reference numerals. As shown in FIG. 6, the semiconductor device 1 of the second embodiment is different from the first embodiment in that, in the digital circuit 2, a logic circuit 38 is provided between the data output terminal (Q terminal) of the flip-flop 13 and the output terminal T22, and a logic circuit 39 is provided between the data output terminal (Q terminal) of the flip-flop 15 and the output terminal T23. The semiconductor device 1 of the second embodiment also includes a three-input EXOR element 43 (EXOR circuit) (an example of the multiple-input logic circuit) to which the output signal from the logic circuit 31 (the signal outputted from the output terminal T21 to the analog circuit 3), the output signal from the logic circuit 38 (the signal outputted from the output terminal T22 to the analog circuit 3), and the output signal from the logic circuit 39 (the signal outputted from the output terminal T23 to the analog circuit 3) are inputted. The output signal from the EXOR element 43 is inputted to the second input terminal of the selector 20. The selector 20 selects the signal inputted from the analog circuit 3 to the digital circuit 2 via the input terminal T11 when in the normal operation mode, and selects the output signal from the EXOR element 43 when in the scan test mode. Therefore, the EXOR element 43 does not function when in the normal operation mode and functions only when in the scan test mode. The other parts of the configuration in FIG. 6 are the same as those in FIG. 1 and therefore will not be described further.

According to the semiconductor device of the second embodiment as described above, the respective output signals from the logic circuits 31, 38 and 39, which are impossible or difficult to observe from outside, are inputted to the EXOR element 43, and the output signal from the EXOR element 43 is inputted to the selector 20. Therefore, the respective output signals from the logic circuits 31, 38 and 39 are observable from outside via the FF 10. Thus, even if the number of output signals from the digital circuit 2 to the analog circuit 3 is greater than the number of input signals from the analog circuit 3 to the digital circuit 2, the failure detection rate of the digital circuit 2 can be efficiently improved.

Also, according to the semiconductor device of the second embodiment, the circuit area can be reduced, compared with the case where three selectors are separately provided in order to observe the respective output signals from the logic circuits 31, 38 and 39.

Moreover, according to the semiconductor device of the second embodiment, since the output signal from the EXOR element 43 changes when an odd number of input signals are changed, the input signals can easily propagate into the output signal. Therefore, compared with the case where an AND circuit, OR circuit or the like is used, the observability of the respective output signals from the logic circuits 31, 38 and 39 can be improved and the test pattern can be shortened.

In addition, the semiconductor device of the second embodiment has similar effects to those of the semiconductor device of the first embodiment.

2. Physical Quantity Sensor

Figure 7:
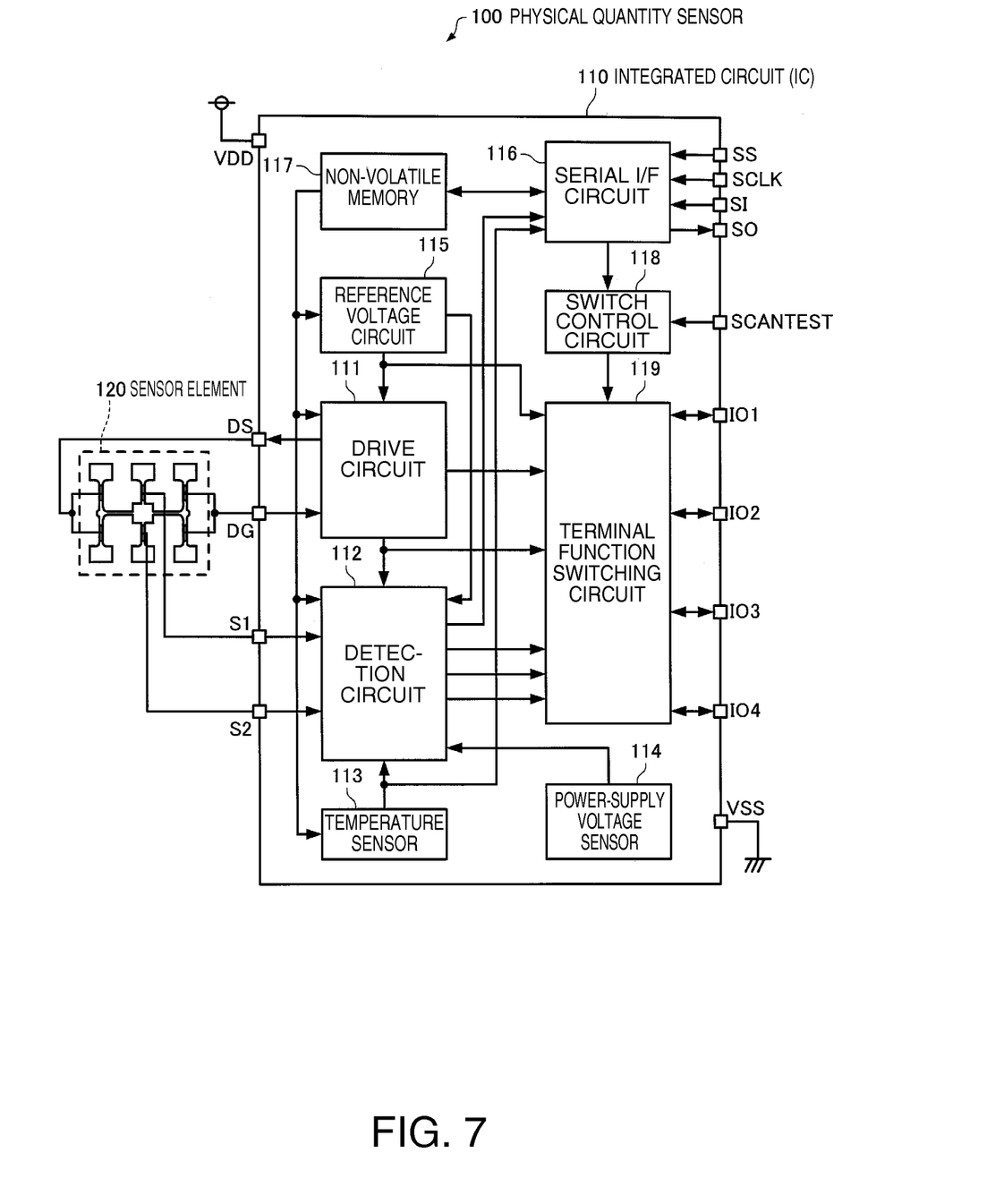
FIG. 7 is a functional block diagram of a physical quantity sensor according to an embodiment.

FIG. 7 is an example of a functional block diagram of a physical quantity sensor according to this embodiment. As shown in FIG. 7, a physical quantity sensor 100 of this embodiment includes an integrated circuit (IC) 110 and a sensor element 120.

In FIG. 7, the sensor element 120 is an oscillating-type piezoelectric angular velocity detection element in which two drive electrodes and two detection electrodes are formed on a so-called double-T crystal oscillating piece including two T-shaped drive oscillating arms and one detection oscillating arm between the drive oscillating arms.

When an AC voltage signal as a drive signal is applied to the two drive oscillating arms of the sensor element 120, an inverse piezoelectric effect causes the drive oscillating arms to perform bending oscillation (excited oscillation) in which the distal ends of the two oscillating arms repeat movements toward and away from each other. If the two drive oscillating arms have the same amplitude of bending oscillation, the two drive oscillating arms perform bending oscillation constantly with line symmetry about the detection oscillating arm. Therefore, the detection oscillating arm does not oscillate.

If an angular velocity about a rotation axis that is perpendicular to the excited oscillation plane of the sensor element 120 is applied in this state, the two drive oscillating arms obtain a Coriolis force in a direction that is perpendicular to both the direction of bending oscillation and the rotation axis. As a result, the symmetry of the bending oscillation of the two drive oscillating arms is broken and detection oscillating arm performs bending oscillation in order to keep balance. The bending oscillation of the detection oscillating arm and the bending oscillation (excited oscillation) of the drive oscillating arms due to the Coriolis force are shifted from each other in phase by 90 degrees. With the piezoelectric effect, AC charges of the opposite phases (phases that are different from each other by 180 degrees) based on the bending oscillation are generated in the two detection electrodes. The AC charges change according to the magnitude of the Coriolis force (that is, the magnitude of the angular velocity applied to the sensor element 120).

The oscillating piece of the sensor element 120 is not limited to a double-T form and may be, for example, in the form of a tuning fork or comb, or may be a tuning bar in the shape of a triangular prism, quadratic prism, circular column or the like. The material of the oscillating piece of the sensor element 120 may be, for example, a piezoelectric material including piezoelectric single crystals such as lithium tantalate ($LiTaO_3$) and lithium niobate ($LiNbO_3$), and piezoelectric ceramics such as lead zirconate titanate (PZT), or a silicon semiconductor, instead of quartz crystal ($SiO_2$). Also, for example, a piezoelectric thin film of zinc oxide (ZnO), aluminum nitride (AlN) or the like held between the drive electrodes may be arranged in a part of the surface of a silicon semiconductor.

The sensor element 120 is not limited to a piezoelectric sensor element and may be an oscillating-type sensor element using an electrodynamic system, electrostatic capacitance system, eddy-current system, optical system, strain gauge system or the like. Alternatively, the type of the sensor element 120 is not limited to an oscillating-type and may be, for example, an optical-type, rotary-type, or fluid-type. The physical quantity detected by the sensor element 120 is not limited to angular velocity and may include angular acceleration, acceleration, velocity, force and the like.

As shown in FIG. 7, in this embodiment, the two drive electrodes of the sensor element 120 are connected respectively to a DS terminal and a DG terminal of the integrated circuit (IC) 110. The two detection electrodes of the sensor element 120 are connected respectively to an S1 terminal and S2 terminal of the integrated circuit (IC) 110.

The integrated circuit (IC) 110 includes a drive circuit 111, a detection circuit 112, a temperature sensor 113, a power-supply voltage sensor 114, a reference voltage circuit 115, a serial interface circuit 116, a non-volatile memory 117, a switch control circuit 118, and a terminal function switching circuit 119. The integrated circuit (IC) 110 of this embodiment may be configured by omitting or changing a part of the elements shown in FIG. 7 or by adding another element.

The reference voltage circuit 115 generates a constant voltage or constant current such as a reference potential (analog ground voltage) from a power-supply voltage supplied from a VDD terminal and supplies the constant voltage or constant current to the drive circuit 111, the detection circuit 112 and the temperature sensor 113.

The drive circuit 111 generates a drive signal for causing the sensor element 120 to perform excited oscillation and supplies the drive signal to one of the drive electrode of the sensor element 120 via a DS terminal. The drive circuit 111 also receives, via a DG terminal, input of a drive current (crystal current) generated in the other drive electrode by the excited oscillation of the sensor element 120, and performs feedback control of the amplitude level of the drive signal so that the amplitude of the drive current is maintained at a constant level. The drive circuit 111 also generates a signal with a phase shifted by 90 degrees from the phase of the drive signal and supplies the signal to the detection circuit 112.

The detection circuit 112 receives input of each of AC charges (detection currents) generated respectively in the two detection electrodes of the sensor element 120, via an S1 terminal and an S2 terminal, then detects only an angular velocity component included in these AC charges (detection currents), and generates a signal (angular velocity signal) of a voltage level corresponding to the magnitude of the angular velocity. In this embodiment, the detection circuit 112 converts the detection currents inputted from the S1 and S2 terminals into voltages, then performs A/D conversion of the voltages by using the signal supplied from the drive circuit 111 (the signal with a phase shifted by 90 degrees from the phase of the drive signal) as a sampling clock, and subsequently generates the detection signal (angular velocity signal) by digital processing.

The temperature sensor 113 generates a signal in which the voltage changes substantially linearly relative to temperature changes, then performs A/D conversion of the signal, and outputs the resulting signal. The temperature sensor 113 can be realized, for example, by using a bandgap reference circuit.

The power-supply voltage sensor 114 performs A/D conversion of the power-supply voltage value supplied from the VDD terminal and outputs the resulting voltage value.

The non-volatile memory 117 holds various adjustment data and correction data for the drive circuit 111, the detection circuit 112 and the temperature sensor 113. The non-volatile memory 117 can be realized, for example, by a MONOS (metal oxide nitride oxide silicon)-type memory.

In the processing to generate the angular velocity signal, the detection circuit 112 carries out 0-point power-supply voltage correction, 0-point temperature correction, and sensitivity temperature correction of the angular velocity signal, using the digital output signals from the temperature sensor 113 and the power-supply voltage sensor 114 and the correction data stored in the non-volatile memory 117.

The angular velocity signal (digital signal) generated by the detection circuit 112 is supplied to the serial interface circuit 116.

The terminal function switching circuit 119 switches connection destinations of four terminals IO1, IO2, IO3 and IO4. For example, under the control of the switch control circuit 118, the terminal function switching circuit 119 can select the output signals or internal signals of the drive circuit 111, the detection circuit 112 and the reference voltage circuit 115, and output the selected signals to outside from one of the IO1, IO2, IO3 and IO4 terminals, or can supply signals inputted from outside via one of the IO1, IO2, IO3 and IO4 terminals, to the drive circuit 111, the detection circuit 112 and the reference voltage circuit 115.

The switch control circuit 118 controls the switching of the connection destinations of the four terminals IO1, IO2, IO3 and IO4, according to a preset value received from the serial interface circuit 116.

Also, for example, a part of the detection circuit 112, a part of the temperature sensor 113, a part of the power-supply voltage sensor 114, the serial interface circuit 116, the switch control circuit 118, and apart of the terminal function switching circuit 119 are digital circuits, and the other parts are analog circuits.

In this embodiment, when a scan test signal inputted from a SCANTEST terminal is at high level, the scan test mode of the digital circuit is set. When in the scan test mode, for example, a clock signal is inputted from an SCLK terminal, a scan in signal is inputted from an SI terminal, and a scan out signal is outputted from an SO terminal.

By incorporating the semiconductor device (IC) 1 of the above embodiment as the integrated circuit (IC) 110, the failure detection rate in the inspection process is improved. This enables realization of a physical quantity sensor with higher reliability.

In the above embodiment, the physical sensor 100 for detecting angular velocity as a physical quantity is described. However, a sensor for detecting not only angular velocity but also other physical quantities such as acceleration and velocity may also be employed. The detection circuit of such a physical quantity sensor can include, as an analog circuit, at least a physical quantity signal generation circuit that generates a signal (physical quantity signal) of a voltage level corresponding to a desired physical quantity from a detection current of the sensor element, and an A/D converter that performs A/D conversion of the generated physical quantity signal. Moreover, the detection circuit can include, as a digital circuit, at least a digital processing circuit that performs filtering, averaging and the like of the digital value of the physical quantity signal generated by the A/D converter.

3. Electronic Apparatus

Figure 8:
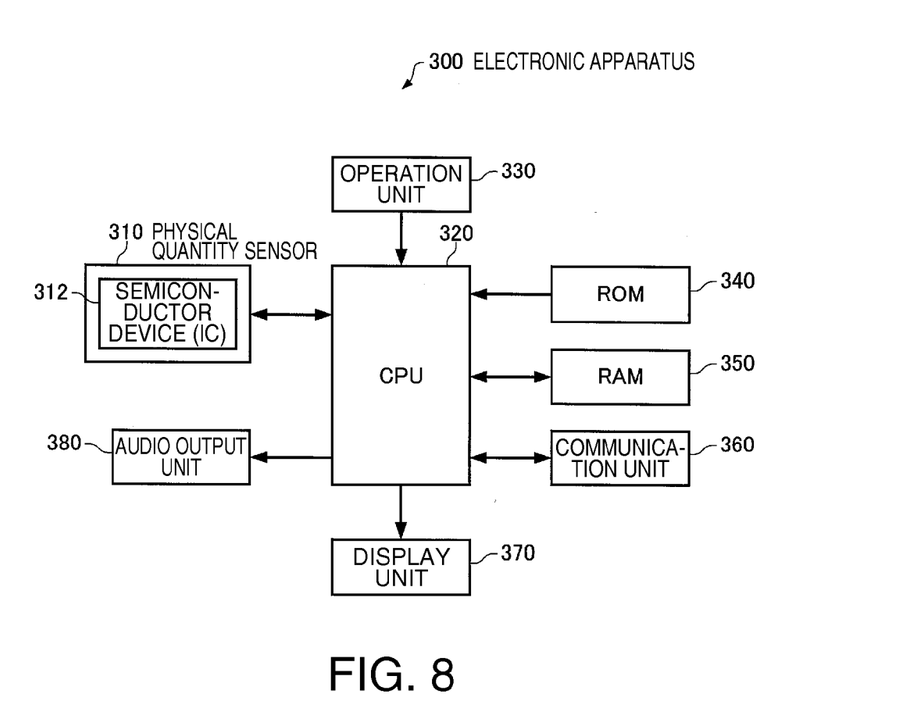
FIG. 8 is a functional block diagram of an electronic apparatus according to an embodiment.
Figure 9:
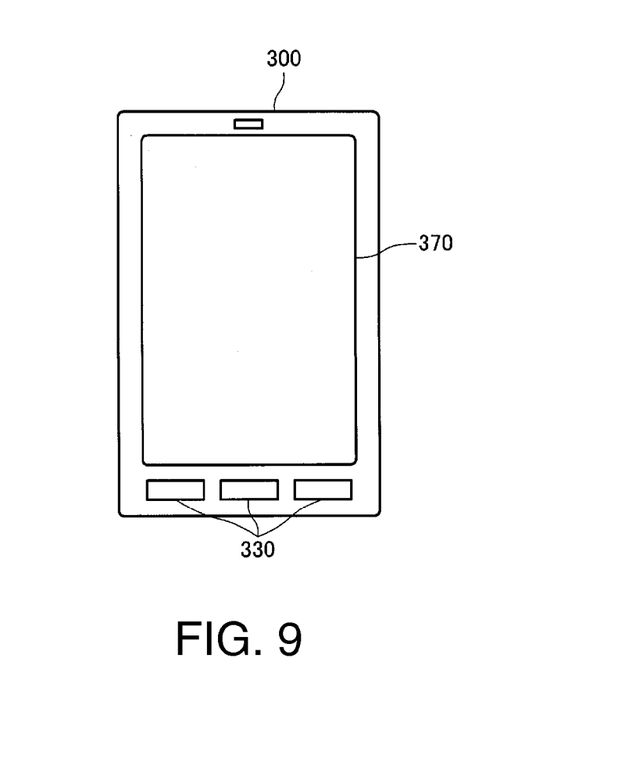
FIG. 9 shows an example of the appearance of an electronic apparatus according to an embodiment.

FIG. 8 is a functional block diagram of an electronic apparatus of this embodiment. FIG. 9 shows an example of an appearance of a smartphone as an example of the electronic apparatus of this embodiment.

An electronic apparatus 300 of this embodiment includes a physical quantity sensor 310, a CPU (central processing unit) 320, an operation unit 330, a ROM (read only memory) 340, a RAN (random access memory) 350, a communication unit 360, a display unit 370, and an audio output unit 380. The electronic apparatus of this embodiment may also be configured by omitting or changing a part of the components (each unit) shown in FIG. 8 or by adding another component.

The physical quantity sensor 310 is a device which detects a physical quantity and outputs a signal (physical quantity signal) of a level corresponding to the detected physical quantity. The physical quantity sensor 310 may be, for example, an inertial sensor which detects at least a part of physical quantities such as acceleration, angular velocity, and velocity, or may be a clinometer which measures an angle of inclination. The physical quantity sensor 310 includes an integrated circuit 312. As the integrated circuit 312, the semiconductor device (IC) 1 of the above embodiment can be used. Also, as the physical quantity sensor 310, for example, the physical quantity sensor 100 of the above embodiment can be used.

The CPU 320 carries out various kinds of calculation processing and control processing using the physical quantity signal outputted from the physical quantity sensor 310, in accordance with a program stored in the ROM 340 or the like. In addition, the CPU 320 carries out various kinds of processing corresponding to an operation signal from the operation unit 330, processing to control the communication unit 360 in order to carry out data communication with the outside, processing to transmit a display signal to cause the display unit 370 to display various kinds of information, processing to cause the audio output unit 380 to output various kinds of sounds, and the like.

The operation unit 330 is an input device including an operation key, a button switch and the like, and outputs an operation signal corresponding to a user's operation to the CPU 320.

The ROM 340 stores programs, data and the like for the CPU 320 to carry out various kinds of calculation processing and control processing.

The RAM 350 is used as a work area for the CPU 320 and temporarily stores programs and data read out from the ROM 340, data inputted from the operation unit 330, results of calculations executed by the CPU 320 according to various programs, and the like.

The communication unit 360 carries out various controls to establish data communication between the CPU 320 and an external device.

The display unit 370 is a display device including an LCD (Liquid Crystal Display) or organic EL display or the like, and displays various kinds of information based on the display signal inputted from the CPU 320. The display unit 370 may be provided with a touch panel that functions as the operation unit 330.

The audio output unit 380 is a device that outputs sounds such as a speaker.

By incorporating the semiconductor device (IC) 1 of the above embodiment as the integrated circuit 312, an electronic apparatus with higher reliability can be realized.

Various electronic apparatuses are conceivable as the electronic apparatus 300. Such electronic apparatuses may include, for example, a personal computer (for example, mobile personal computer, laptop personal computer, notebook-type personal computer, or tablet-type personal computer), mobile terminal such as mobile phone, digital still camera, ink jet ejection device (for example, ink jet printer), storage area network equipment such as router and switch, local area network equipment, television set, video camera, video tape recorder, car navigation system, pager, electronic notebook (including those with communication functions), electronic dictionary, electronic calculator, electronic game device, game controller, word processor, workstation, TV phone, surveillance television monitor, electronic binocular, POS terminal, medical equipment (for example, electronic thermometer sphygmomanometer, glucose meter, electrocardiograph, ultrasonic diagnosis device, and electronic endoscope), fishfinder, various measuring devices, gauges (for example, gauges in vehicles, aircraft and vessels), flight simulator, head-mounted display, motion tracer, motion tracker, motion controller, PDR (pedestrian dead reckoning) positioning unit, and the like.

4. Moving Object

Figure 10:
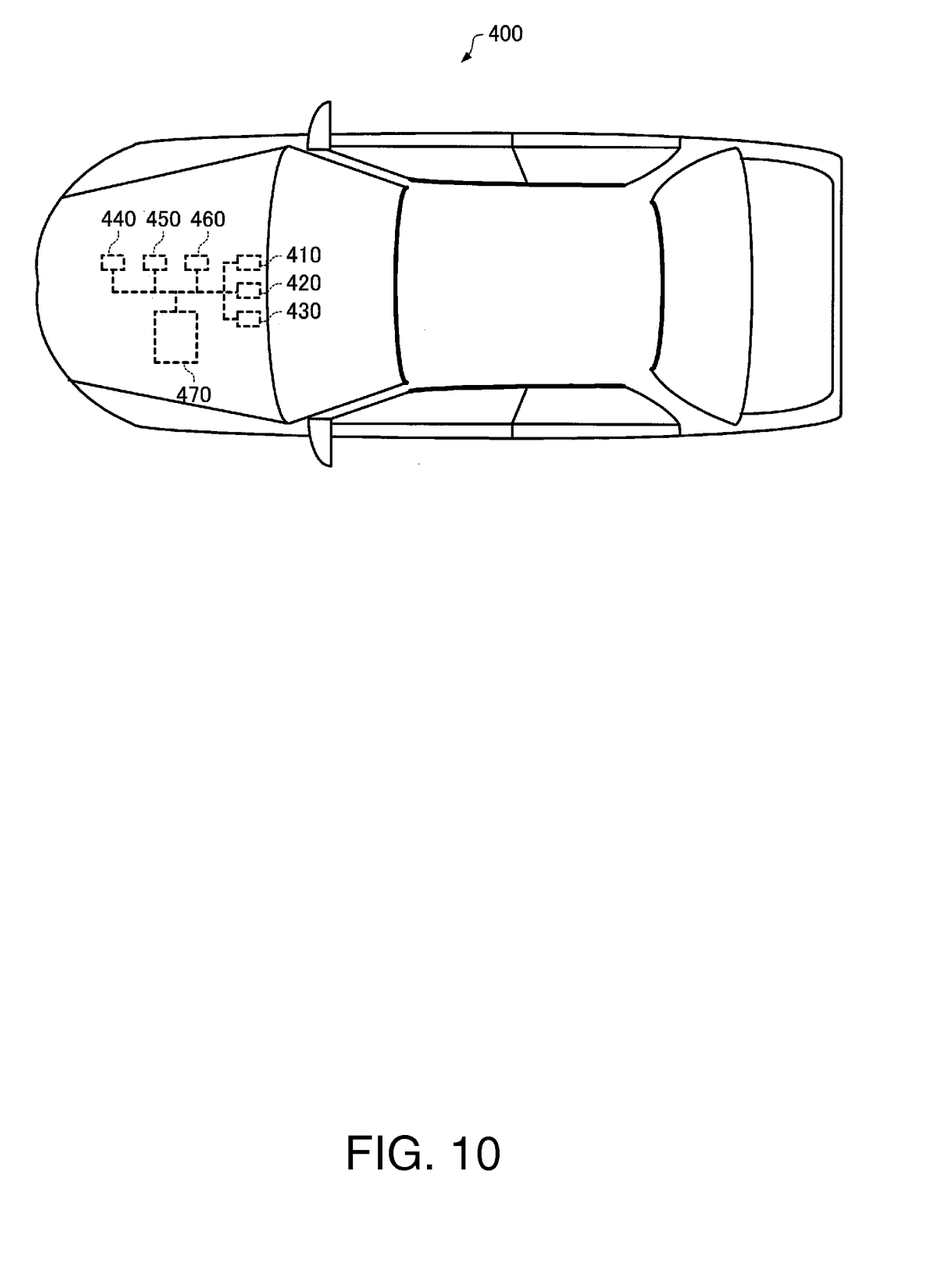
FIG. 10 shows an example of a moving object according to an embodiment.

FIG. 10 is a top view showing an example of a moving object of this embodiment. A moving object 400 shown in FIG. 10 includes physical quantity sensors 410, 420, 430, controllers 440, 450, 460, and a battery 470. The moving object of this embodiment may be configured by omitting or changing a part of the components (each unit) shown in FIG. 10 or by adding another component.

The physical quantity sensors 410, 420, 430 and the controllers 440, 450, 460 operate with a power-supply voltage supplied from the battery 470.

The physical quantity sensors 410, 420, 430 are devices which detect a physical quantity and output a signal (physical quantity signal) of a level corresponding to the detected physical quantity. Each of the physical quantity sensors 410, 420, 430 may be, for example, an angular velocity sensor, acceleration sensor, velocity sensor, clinometer, or the like.

The controllers 440, 450, 460 respectively carry out various controls of an attitude control system, a roll-over prevention system, a braking system and the like, using a part or all of the physical quantity signals outputted from the physical quantity sensors 410, 420, 430.

For example, the semiconductor device (IC) 1 of the above embodiment can be used as the integrated circuit included in the physical quantity sensors 410, 420, 430 and the controllers 440, 450, 460 and the like, or the physical quantity sensor 100 of the above embodiment can be used as the physical quantity sensors 410, 420, 430. Thus, higher reliability can be secured.

Various moving objects are conceivable as the moving object 400. Such moving objects may be, for example, an automobile (including electronic vehicles), aircraft such as jet plane and helicopter, vessel, rocket, artificial satellite and the like.

The invention is not limited to the embodiments and various modifications can be made without departing from the scope of the invention.

For example, while in the above embodiments, all of the FF 10 to FF 18 are included in one scan chain extending from the external input terminal T1 to the external output terminal T5, these flip-flops may be included in one of plural scan chains, each extending from a separate external input terminal to a separate external output terminal.

The above embodiments are simply illustrative examples and not limiting. For example, the embodiments can also be suitably combined.

The invention includes the configurations described in the embodiments and also substantially the same configurations (for example, a configuration having the same function, method and result, or a configuration having the same object and effect). The invention also includes the configurations described in the embodiments in which a non-essential part is replaced. The invention also includes a configuration having the same advantages and effects as the configurations described in the embodiments, or a configuration that can achieve the same object. Moreover, the invention includes the configurations described in the embodiments to which a known technique is added.

The entire disclosure of Japanese Patent Application No. 2013-069497, filed Mar. 28, 2013 is expressly incorporated by reference herein.

What is claimed is:

1. A semiconductor device comprising:
    a digital circuit having a scan test mode and a normal operation mode different from the scan test mode; and
    an analog circuit having an interface with the digital circuit, wherein:
    the digital circuit includes:
        a first flip-flop that forms a part of a scan chain when in the scan test mode,
        a first selector provided on an input side of the first flip-flop and capable of selecting a first signal when in the normal operation mode, and capable of selecting a second signal that is different from the first signal when in the scan test mode,
        a second flip-flop that forms a part of the scan chain when in the scan test mode, and
        a first logic element provided in a signal path extending from and between an output of the first selector to an input of the first flip-flop, further wherein:
    the first signal is an input signal to the digital circuit from the analog circuit, and
    the second signal is an output signal from the second flip-flop.

2. The semiconductor device according to claim 1, wherein the second signal is an output signal from the digital circuit to the analog circuit.

3. The semiconductor device according to claim 1, wherein the second signal is an input signal to a second logic element in which a logic level of an output signal is fixed when in the scan test mode.

4. The semiconductor device according to claim 1, wherein the first signal is a signal in which a logic level is fixed when in the scan test mode.

5. The semiconductor device according to claim 1, wherein the first selector constantly selects the second signal when in the scan test mode.

6. The semiconductor device according to claim 1, wherein the digital circuit includes a third flip-flop that forms a part of the scan chain when in the scan test mode, and
    the first selector selects the first signal or the second signal in response to an output signal from the third flip-flop when in the scan test mode.

7. The semiconductor device according to claim 1, wherein the second signal is an output signal from a multiple-input logic circuit that does not function when not in the scan test mode.

8. The semiconductor device according to claim 7, wherein at least a part of input signals to the multiple-input logic circuit is an output signal from the digital circuit to the analog circuit, or an input signal to a second logic element in which a logic level of an output signal is fixed when in the scan test mode.

9. A physical quantity sensor comprising:
    a sensor element that detects a physical quantity; and
    the semiconductor device according to claim 1 that generates a signal corresponding to the physical quantity, based on a detection signal from the sensor element.

10. An electronic apparatus comprising the semiconductor device according to claim 1.

11. A moving object comprising the semiconductor device according to claim 1.

* * * * *